US012532539B2

(12) United States Patent
Huynh-Bao et al.

(10) Patent No.: US 12,532,539 B2
(45) Date of Patent: Jan. 20, 2026

(54) METHOD FOR MANUFACTURING A SEOI INTEGRATED CIRCUIT CHIP

(71) Applicant: Soitec, Bernin (FR)

(72) Inventors: Trong Huynh-Bao, Ottawa (CA);
Bich-Yen Nguyen, Austin, TX (US);
Christophe Maleville, Lumbin (FR)

(73) Assignee: Soitec, Bernin (FR)

(*) Notice: Subject to any disclaimer, the term of this patent is extended or adjusted under 35 U.S.C. 154(b) by 519 days.

(21) Appl. No.: 17/995,791

(22) PCT Filed: Mar. 29, 2021

(86) PCT No.: PCT/EP2021/058163
§ 371 (c)(1),
(2) Date: Oct. 7, 2022

(87) PCT Pub. No.: WO2021/204580
PCT Pub. Date: Oct. 14, 2021

(65) Prior Publication Data
US 2023/0170264 A1    Jun. 1, 2023

(30) Foreign Application Priority Data
Apr. 7, 2020 (FR) ..................... 2003449

(51) Int. Cl.
*H01L 21/84* (2006.01)
*H01L 21/762* (2006.01)
(Continued)

(52) U.S. Cl.
CPC ....... *H10D 86/01* (2025.01); *H01L 21/76281* (2013.01); *H10D 64/518* (2025.01); *H10D 86/201* (2025.01)

(58) Field of Classification Search
CPC . H10D 86/201; H10D 86/215; H10D 30/0245
See application file for complete search history.

(56) References Cited

U.S. PATENT DOCUMENTS 6,462,723 B1 * 10/2002 Yamazaki .............. H04N 9/312
345/212
6,835,983 B2 * 12/2004 Ning ...................... H10D 86/01
257/349
(Continued)

FOREIGN PATENT DOCUMENTS

CN        1450658 A        10/2003
JP    2004-071963 A         3/2004
(Continued)

OTHER PUBLICATIONS

Taiwanese Office Action and Search Report for Application No. 110112396 dated Aug. 19, 2024, 18 pages with machine translation.
(Continued)

*Primary Examiner* — John A Bodnar
(74) *Attorney, Agent, or Firm* — TraskBritt (57) ABSTRACT

A method for manufacturing a semiconductor-on-insulator (SeOI) chip comprises: a) providing a SeOI structure, b) building a plurality of isolated field effect transistors (FET) each comprising: —a preliminary gate above a channel region, the FETs from a first group having a first preliminary gate length and the FETs from a second group having a smaller second preliminary gate length, —a source region and a drain region, and —a source electrode and a drain electrode, c) removing at least the preliminary gates of the FETs from the second group, leaving access to channel regions of the FETs, d) thinning a top layer in channel regions of the FETs from the second group, the top layer in channel regions of the first group of FETs having a different thickness, and e) forming functional gates simultaneously on channel regions of the FETs whose preliminary gates were removed.

17 Claims, 6 Drawing Sheets

(51) Int. Cl.
  *H01L 27/12* (2006.01)
  *H01L 29/423* (2006.01)
  *H10D 64/27* (2025.01)
  *H10D 86/00* (2025.01)
  *H10D 86/01* (2025.01)

(56) References Cited

U.S. PATENT DOCUMENTS

| | | | |
|---|---|---|---|
| 8,962,418 B2* | 2/2015 | Hoshino | H10D 64/693 |
| | | | 438/149 |
| 2003/0162358 A1 | 8/2003 | Hanafi et al. | |
| 2003/0183877 A1 | 10/2003 | Yagishita et al. | |
| 2004/0079993 A1 | 4/2004 | Ning et al. | |
| 2004/0124492 A1 | 7/2004 | Matsuo | |
| 2005/0090066 A1 | 4/2005 | Zhu et al. | |
| 2005/0139921 A1* | 6/2005 | Kang | H10D 10/021 |
| | | | 257/E21.703 |
| 2006/0001095 A1* | 1/2006 | Doris | H10D 64/017 |
| | | | 438/149 |
| 2013/0200433 A1 | 8/2013 | Adam et al. | |

FOREIGN PATENT DOCUMENTS

| | | |
|---|---|---|
| KR | 10-2000-0046768 A | 7/2000 |
| KR | 10-2001-0110769 A | 12/2001 |

OTHER PUBLICATIONS

Korean Office Action for Application No. 10-2022-7035699 dated Jan. 8, 2025, 16 pages with English translation.
Chen et al., Fully Depleted Extremely Thin SOI Technology Fabricated by a Novel Integration Scheme Featuring Implant-Free, Zero-Silicon-Loss, and Faceted Raised Source/Drain, 2009 Symposium on VLSI Technology, (Aug. 2009), 3 pages.
International Search Report for International Application No. PCT/EP2021/058163 dated Jun. 28, 2021, 3 pages.
International Written Opinion for International Application No. PCT/EP2021/058163 dated Jun. 28, 2021, 5 pages.
Chinese Office Action for Application No. 202180025860.9 dated May 28, 2025, 20 pages with English translation.
Korean Office Action for Application No. 10-2025-7031359 dated Nov. 12, 2025, 7 pages with English translation.

* cited by examiner

METHOD FOR MANUFACTURING A SEOI INTEGRATED CIRCUIT CHIP

CROSS-REFERENCE TO RELATED APPLICATIONS

This application is a national phase entry under 35 U.S.C. § 371 of International Patent Application PCT/EP2021/058163, filed Mar. 29, 2021, designating the United States of America and published as International Patent Publication WO 2021/204580 A1 on Oct. 14, 2021, which claims the benefit under Article 8 of the Patent Cooperation Treaty to French Patent Application Serial No. FR2003449, filed Apr. 7, 2020.

TECHNICAL FIELD

The present disclosure concerns a method for manufacturing a semiconductor-on-insulator (SeOI) integrated circuit chip for mixed signal applications.

BACKGROUND

There is a growing interest in building chips with integrated circuits (System-On-Chips ("SOC")) for managing complex mixed signals in miniaturized systems.

The document U.S. Pat. No. 6,835,983 proposes a SOI (silicon-on-insulator) substrate with a top silicon-containing layer presenting different thicknesses, which enables to co-integrate fully-depleted (FD) and partially-depleted (PD) CMOS devices (Complementary Metal Oxide Semiconductor) on the same chip, through a same sequence of processing steps.

Unfortunately, to provide high performance devices, the manufacturing processes to build FD and PD devices should preferably be different. For instance, for extremely thin top Si-containing layer (adapted for FD devices), the classical dopant implantation used to elaborate wells regions under the source and the drain electrodes of PD devices is susceptible to damage the top Si-containing layer as well as the buried oxide. Chen et al., in his paper named "Fully depleted extremely thin SOI technology fabricated by a novel integration scheme featuring implant-free, zero-silicon-loss and faceted raised source/drain" (2009 Symposium on VLSI Technology Digest of technical papers, p 212), proposes a solution avoiding classical dopant implant and providing high performance FD devices.

Generally, the co-integration processes used to build integrated circuit chips rely on a SOI substrate presenting either an initial thin top layer that will be thickened locally, or an initial thick top layer that will be thinned down locally. Starting with a top layer presenting at least two thicknesses and aiming to fabricate high performance devices lead usually to sequential manufacturing processes to elaborate the thick layer-based device first, and second the thin layer-based device, or vice versa. Such sequential elaboration originates high complexity in manufacturing processes and high costs.

BRIEF SUMMARY

The present disclosure relates to an alternative solution regarding the ones of the state of the art and is intended to remedy all or some of the aforementioned drawbacks. It relates in particular to a method for manufacturing semiconductor-on-insulator integrated circuit chips, for mixed signal applications that requires high performance, low leakage for low voltage logic, analog and RF (radiofrequency) devices, and good reliability for high voltage analog, RF (radiofrequency) and I/O (input/output) devices.

The present disclosure relates to a method for manufacturing a semiconductor-on-insulator integrated circuit chip comprising the following steps:
  a) providing a semiconductor-on-insulator structure having a buried insulating layer that is sandwiched between a support substrate and a top semiconductor-containing layer, the top semiconductor-containing layer having a first thickness throughout the semiconductor-on-insulator structure,
  b) building a plurality of field effect transistors, wherein each field effect transistor is isolated from the others and comprises:
    a preliminary gate above a channel region of the top semiconductor-containing layer, the field effect transistors from a first group having a first preliminary gate length and the field effect transistors from a second group having a second preliminary gate length smaller than the first one,
    a source region and a drain region formed by n-type or p-type dopant implantation in the top semiconductor-containing layer, and extending down to the buried insulating layer,
    a source electrode and a drain electrode respectively on the source region and the drain region,
  c) removing at least the preliminary gates of the field effect transistors from the second group, leaving access to the channel regions of the field effect transistors,
  d) thinning the top semiconductor-containing layer in channel regions of the field effect transistors from the second group, so as to reach a second thickness, wherein the top semiconductor-containing layer in channel regions of the field effect transistors from the first group has the first thickness,
  e) forming functional gates simultaneously on channel regions of the field effect transistors whose preliminary gate was removed,
  wherein a chip comprises at least one field effect transistor from the first group and at least one field effect transistor from the second group.

According to other advantageous and non-limiting characteristics of the disclosure, taken alone or in any technically feasible combination:
  the step c) comprises removing the preliminary gates of the field effect transistors from the first group, leaving access to the channel regions of the field effect transistors;
  the step of thinning comprises a two-stages etch, a first etch up to 1 nm to 5 nm of the second thickness, and a second etch with slow etching rate to reach the second thickness;
  the first etch is based on anisotropic dry etching;
  the second etch is based on wet or dry etching, or atomic layer etching, with a etch rate lower than 1 nm/minute;
  the first thickness is comprised between 20 nm and 80 nm;
  the second thickness is comprised between 4 nm and 20 nm;
  the second thickness is equal to a quarter of a length of the gate electrode of the field effect transistor (FET) devices from the second group;
  the buried insulating layer has a thickness comprised between 5 nm to few micrometers, preferentially between 10 nm and 50 nm;
  the step a) of building a plurality of field effect transistors comprises, before the formation of the preliminary gates, the formation of back gates under the buried insulating layer, in the support substrate, opposite to the subsequently formed preliminary gates of the field effect transistors from the first group and/or from the second group;

the field effect transistors are based on planar or 3D or finFET device architectures;

the field effect transistors of the first group are high voltage analog, RF and/or I/O devices;

the field effect transistors of the second group are low voltage digital and/or RF devices;

the step d) comprises thinning the top semiconductor-containing layer in channel regions of field effect transistors from a third group, so as to reach a third thickness, different from the second thickness, the step e) comprises forming the same functional gate on each channel region of the field effect transistors from the third group, wherein a chip comprises at least one field effect transistor from the third group;

the top semiconductor-containing layer comprises at least one material among silicon, silicon germanium, silicon carbide, III-V compounds or gallium nitride;

the support substrate comprises monocrystalline and/or poly-crystalline silicon, or a combination of other semiconductor materials.

BRIEF DESCRIPTION OF THE DRAWINGS

Other characteristics and advantages of the disclosure will emerge from the detailed description of example embodiments of the disclosure that will follow with reference to the accompanying figures in which.

DETAILED DESCRIPTION

In the descriptive part, the same references in the figures can be used for elements of the same type. The figures are schematic representations that, for purposes of readability, are not to scale. In particular, the thicknesses of the layers along the z axis are not to scale with respect to the lateral dimensions along the x and y axes; and the relative thicknesses of the layers between them are not necessarily respected in the figures.

The present disclosure relates to a method for manufacturing an integrated circuit chip based on a semiconductor-on-insulator (SeOI) structure. As well known in the microelectronics domain, SeOI structures include notably SOI structures (Silicon on insulator). A plurality of chips is elaborated collectively on a SeOI structure, until the singularization stage.

By integrated circuit chip, it is meant a chip including different types of devices co-integrated on the same SeOI structure, and adapted to mixed signal applications. For instance, each chip may comprise a device from a first group, performing high voltage analog, RF or I/O functions, and a device from a second group, enabling high performance, low power digital, RF and mixed signal functions.

Figure 1:
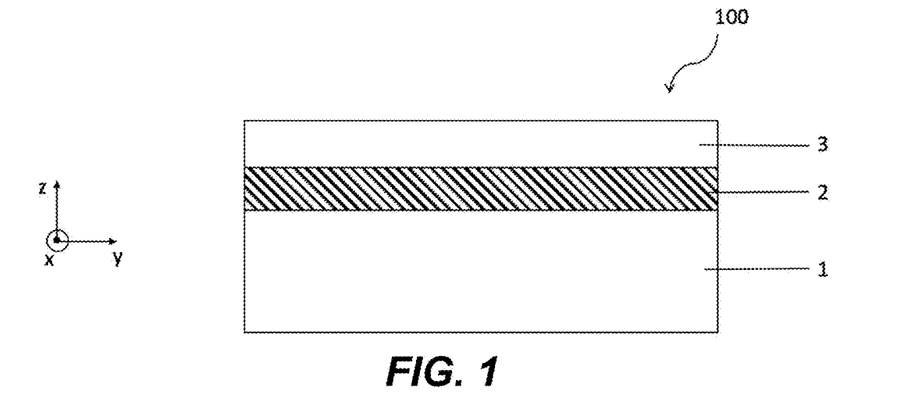
FIG. 1 presents the step a) of the method according to the disclosure.

First, the method for manufacturing a SeOI integrated circuit chip comprises a step a) of providing a SeOI structure 100, having a buried insulating layer 2 that is sandwiched between a support substrate 1 and a top semiconductor-containing layer 3 (FIG. 1). For the targeted applications, the SeOI structure 100 is most usually in the form of a wafer whose diameter is 300 mm, or even 450 mm.

The top semiconductor-containing layer 3 may comprise at least one material among silicon, silicon germanium, silicon carbide, III-V semiconductors compound, gallium nitride or other compound semiconductor materials. In the following of this description, the terms "top layer 3" and "top semiconductor-containing layer 3" may be used interchangeably.

Preferably, the support substrate 1 of SeOI structure 100 is made of silicon, as this material is the most common one used in microelectronics applications. Nevertheless, the support substrate 1 could also comprise stacked layers, for instance a combination of monocrystalline and/or poly-crystalline silicon (for instance, to include a charge-trapping layer enhancing performances of RF devices, as well known), or a combination of other semiconductor materials.

Preferably, the buried insulating layer 2 of SeOI structure 100 is made of silicon dioxide, but other dielectric materials or stacks may be used (such as, silicon oxynitride, silicon nitride, etc.). The buried insulating layer 2 may have a thickness comprised between 5 nm to few micrometers, preferentially between 10 nm and 50 nm.

At the step a) of the method, the top semiconductor-containing layer 3 has a first thickness throughout the SeOI structure 100. The first thickness is preferably comprised between 20 nm and 80 nm.

The method according to the present disclosure co-integrates high voltage and low voltage devices on a relatively thin top semiconductor-containing layer 3 (less than 80 nm thick), and to reach for each type of device a high-performance level, while simplifying the manufacturing process. High voltage means equal to or higher than 1.8V, for instance, 1.8V, 2.5V, 3.3V, 5V, etc. Low voltage means lower than 1.8V, typically 0.8V, 0.5V, etc.

At this stage, the doping level and type of the top semiconductor-containing layer 3 is preferably not intentionally doped (undoped), but could eventually be intentionally doped with either n-type of p-type dopants, at least locally in the regions that will host the future devices channel, for tuning the threshold voltages of the devices, whether partially or fully depleted.

The manufacturing process of the SeOI structure 100 will not be described here in detailed. Several methods to do so are well known, for example, the SMART CUT® process that enables the transfer of thin and uniform semiconductor layers onto a support substrate.

The method for manufacturing a SeOI integrated circuit chip then comprises a step b) of building a plurality of field effect transistors (FET) 110, 120 on the SeOI structure 100. For elaborating FET devices, several process operations are required.

Figure 2A:
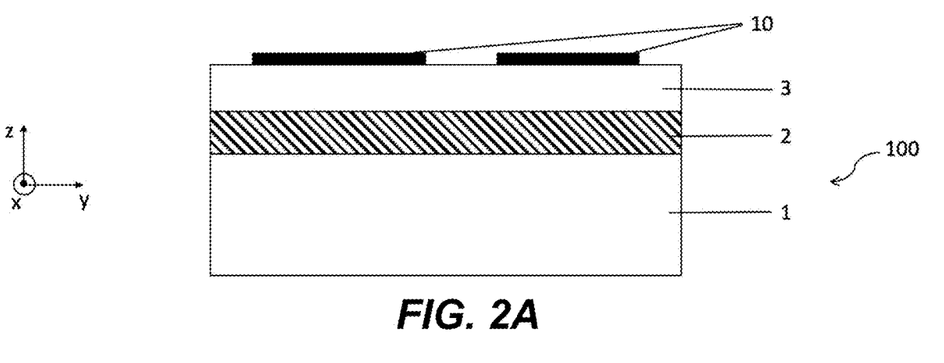
FIGS. 2A-2E present various stages or options in the step b) of the method according to the disclosure.

First, a patterned mask 10, which may include silicon nitride (SiN) layer, is formed on predetermined positions atop the top layer 3 of the SeOI structure 100 (FIG. 2A). The pattern mask 10 will allow formation of isolation regions in the top layer 3.

Figure 2B:
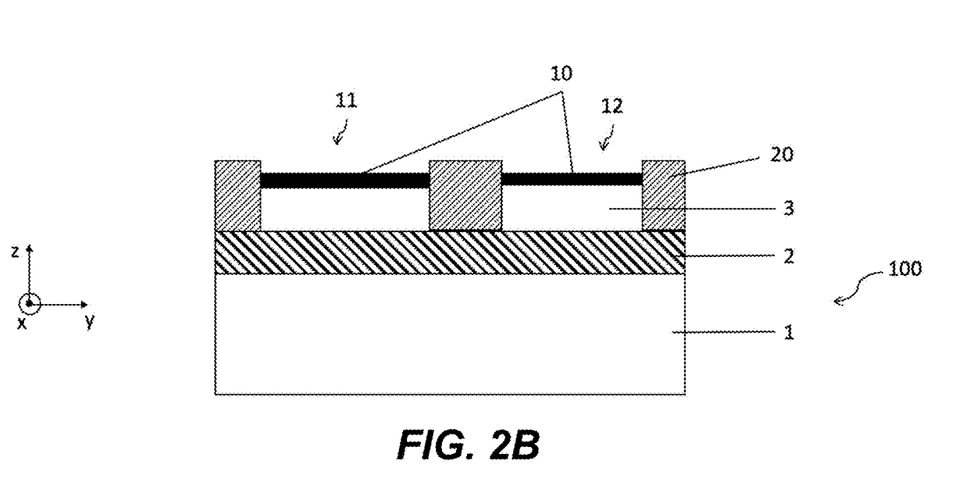

To do so, the areas of the top layer 3, free of masking, may be oxidized using a conventional oxidation process so as to form isolation regions 20, reaching down to the buried insulating layer 2 of the SeOI structure 100 (FIG. 2B). Alternatively, the areas free of masking are etched down to the support substrate 1 and conventional oxide deposition process is used to fill the etched regions, so as to form isolation regions 21 (FIG. 2B').

The isolation regions 20, 21 isolate each FET device to be built from its neighbors. The patterns of the mask 10 are thus defined based on the type, position and number of FET devices targeted in each integrated circuit chip to be fabricated on the SeOI structure 100. For simplicity, we will illustrate the fabrication of a chip including a field effect transistor (for high voltage RF, analog or I/O functions) from a first group, in a first position 11, and a field effect transistor (for low voltage digital or RF functions) from a second group, in a second position 12 (FIGS. 2B, 2B'). Although any of the two embodiments illustrated on FIGS. 2B and 2B' could be implemented, the next figures will be based on the second one (FIG. 2B'), for sake of simplicity and clarity.

The patterned mask 10 is then removed, using dry or wet etch processes.

Secondly, a preliminary gate 31, 32 is formed for each FET device to be built. The term preliminary is used here because the preliminary gate 32 of a FET device from the second group (also named second preliminary gate 32) and eventually the preliminary gate 31 of a FET device from the first group (also named first preliminary gate 31) are intended to be totally or partially removed in a later step of the method. Thus, the preliminary gates 31, 32 are not necessarily functional at this stage.

Figure 2C:
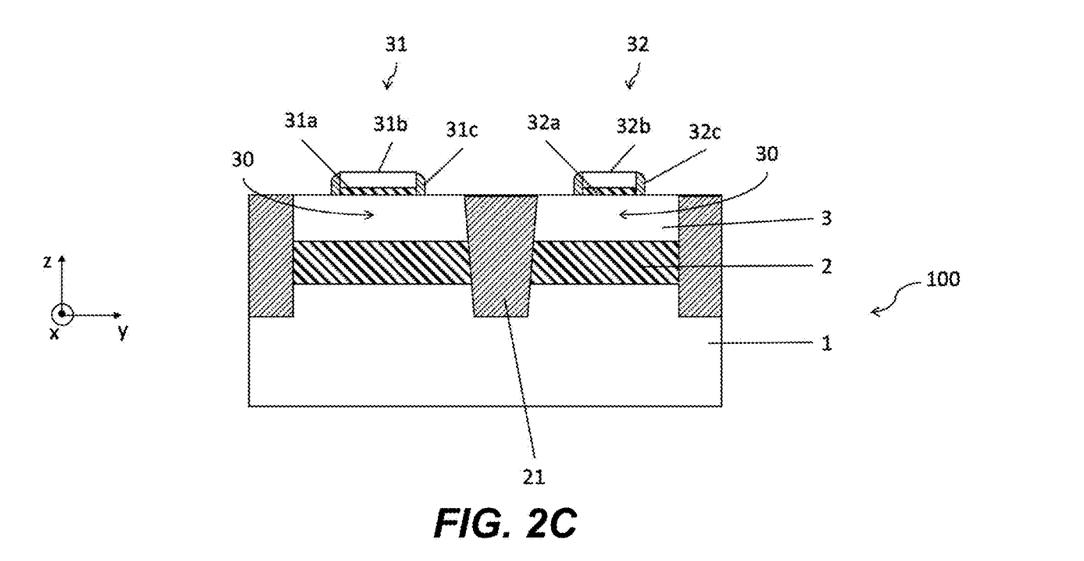

Each preliminary gate 31, 32 includes a gate dielectric 31a, 32a, directly disposed on the top semiconductor-containing layer 3, and a gate electrode 31b, 32b disposed on the gate dielectric 31a, 32a (FIG. 2C). The gate dielectric 31a, 32a may include silicon oxides, silicon nitrides, silicon oxynitrides or combinations thereof. The gate electrode 31b, 32b may include conductive material such as undoped or doped polysilicon. The gate electrode 31b, 32b may also be formed of other materials (such as dielectrics), if ultimately removed, as it does not need to be functional.

Preferably, a spacer layer 31c, 32c is formed on the sides of each preliminary gate 31, 32 to isolate it from the source and drain elements to be processed later. The spacer layer 31c, 32c is usually made of dielectric material such as silicon oxynitride or silicon nitride.

The preliminary gates 31, 32 can be formed via conventional oxidation and/or deposition processes involving lithography and etch processes for patterning.

The preliminary gate 31, 32 is disposed above the channel region 30 of each FET device to be built, the channel region 30 being part of the top semiconductor-containing layer 3. As it is well known, the channel region 30 will conduct the current between the source and the drain of the FET device in the on-state of the transistor.

In the first group of FET devices, the first preliminary gate 31 has a first length, and in the second group of FET devices, the second preliminary gate 32 has a second length, smaller than the first one.

The length is here the dimension of the gate 31, 32 along they axis on the figures. In a FET device, the gate length is correlated to the thickness (along z axis on the figures) of the top semiconductor-containing layer 3 in the channel region 30 of the device. The gate length may be equal or close to four times the channel thickness to operate the field effect transistor in a fully depleted mode; it may be smaller than four times the channel thickness to operate the FET device in a partially depleted mode.

Note that, all the preliminary gates 31, 32 from the first or second group, whether they have respectively the first length or the second length, are elaborated at the same time, with the same process flow.

Optionally, the step a) comprises, before the formation of the preliminary gates 31, 32, the formation of back gates (not represented) under the buried insulating layer 2, in the support substrate 1, opposite to the preliminary gates 31, 32 location. Usually, the back gates are elaborated by dopant implantation, locally in the support substrate 1, so as to form a conductive region on which a back bias can be applied to more finely control the current conduction in the channel region 30 of the final FET devices (lower leakage).

Thirdly, a source region 40 and a drain region 50 are formed for each FET device simultaneously, by n-type or p-type dopant implantation in the top semiconductor-containing layer 3 and subsequent thermal annealing.

The conditions of the ion implant and thermal anneal are tuned for optimum lateral dimensions and depth of source/drain junction for the best on-state and off-state current.

Figure 2D:
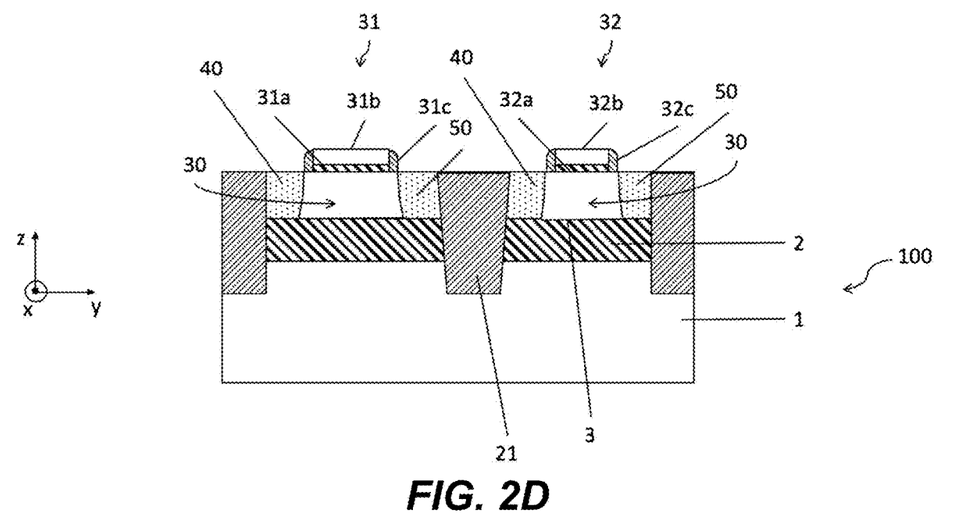

The source region 40 and the drain region 50 are formed out of the channel region 30 and extend down to the buried insulating layer 2 (FIG. 2D).

Optionally, it may be advantageous to thicken the source 40 and drain 50 regions. To do so, selective epitaxy may be performed on top of the source 40 and drain 50 regions, either before the previously stated dopant implantation or after it. In this later case, in situ doped selective epitaxy may be implemented.

Figure 2E:
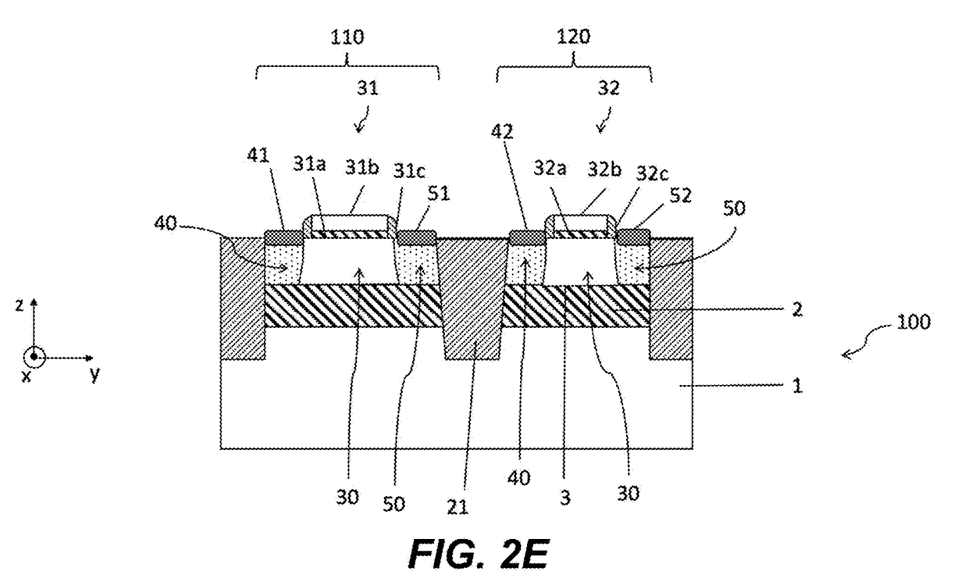

Subsequently, a source electrode 41, 42 and a drain electrode 51, 52 are built respectively on the source region 40 and on the drain region 50, for instance by silicidation (involving nickel silicide, titanium silicide or cobalt silicide, etc.), according to conventional processes based on deposition, lithography and etch processes for patterning, and annealing stage, to form silicide electrodes 41, 42, 51, 52 on top of the doped regions 40, 50 (FIG. 2E).

Here again, an advantage of the present disclosure is to perform the engineering of the source 40 and drain 50 regions at the same time, with the same process flow, for all the FET devices, whether they are from the first group or from the second group.

The step b) of the method leads to the formation of a plurality of field effect transistors 110, in the first position 11, belonging to the first group (high voltage devices), and a plurality of field effect transistors 120, in the second position 12, belonging to the second group (low voltage devices), each FET device 110, 120 being isolated from the others.

Figure 3A:
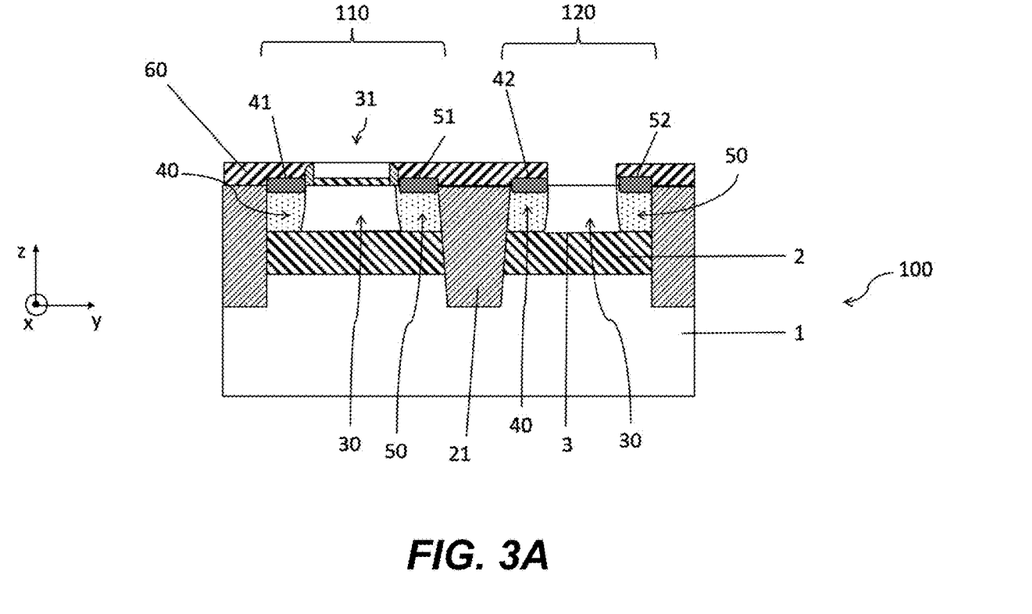
FIGS. 3A and 3B present various options in the step c) of the method according to the disclosure.

The method for manufacturing a SeOI integrated circuit chip according to the present disclosure then comprises a step c) of removing at least the second preliminary gates 32 of the field effect transistors 120 from the second group, leaving access to the channel regions 30 of the field effect transistors (FIG. 3A). In some embodiments, the first preliminary gates 31 of the field effect transistors 110 from the first group may also be removed during the step c).

To do so, a thin silicon nitride layer (not represented) may be deposited on source 41, 42 and drain 51, 52 electrodes followed by a thick silicon oxide layer 60 deposited over the whole surface of the SeOI structure 100, by chemical vapor deposition techniques. Then, the silicon oxide layer 60 is polished until the surface flush the preliminary gates 31, 32. The deposited silicon oxide layer 60 plays the role of protection layer over the areas of the FET devices 110, 120, other than the preliminary gates 31, 32 that are to be removed.

Then, conventional dry or wet etch processes may be used, to remove sequentially the second preliminary gate electrodes 32b and the second preliminary gate dielectrics 32a.

If the first preliminary gate 31 has been designed to be functional and is intended to remain as it is on the final chip, it may be advantageous to form, at step b), the second gate electrode 32b with a material different from the one of the first gate electrode 31b, so as to allow the removal of the second preliminary gate 32 selectively vis-à-vis the first preliminary gate 31. The first preliminary gate 31 may thus remain integral without damage. Additional protection layer may also be deposited on the first preliminary gate 31 to avoid any damage during the step c), when only the second preliminary gate 32 is removed.

Figure 3B:
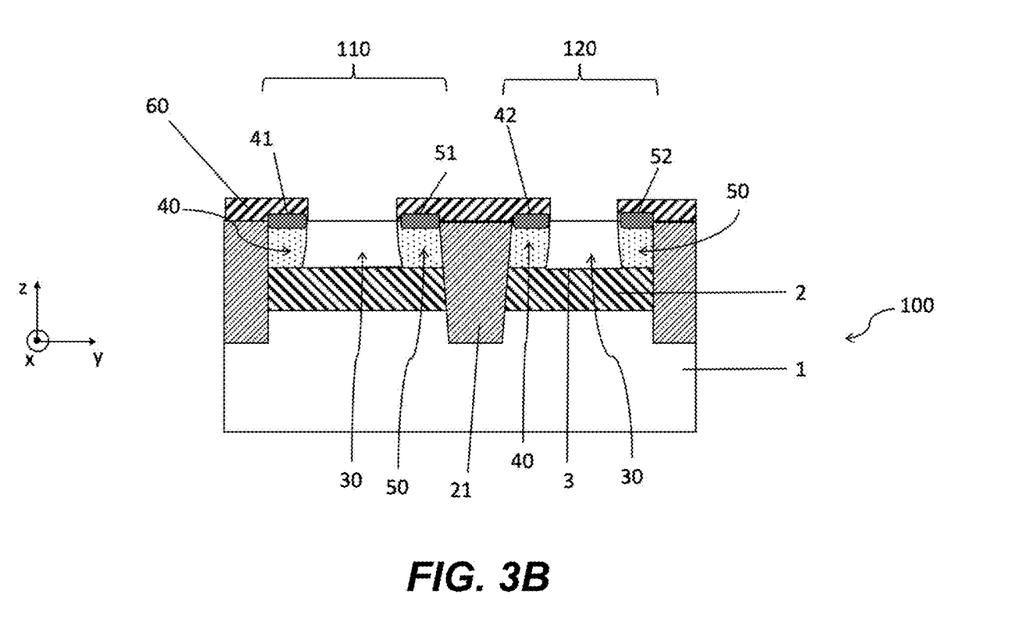

As previously mentioned, optionally the first preliminary gate 31 may also be removed during the step c), leaving access to the channel regions 30 of the field effect transistors 110 from the first group (FIG. 3B). In this case, the first and second preliminary gates 31, 32 are preferably formed with the same materials at step b) and the removal can be performed at the same time, with the same process, for all the FET devices 110, 120.

Figure 4:
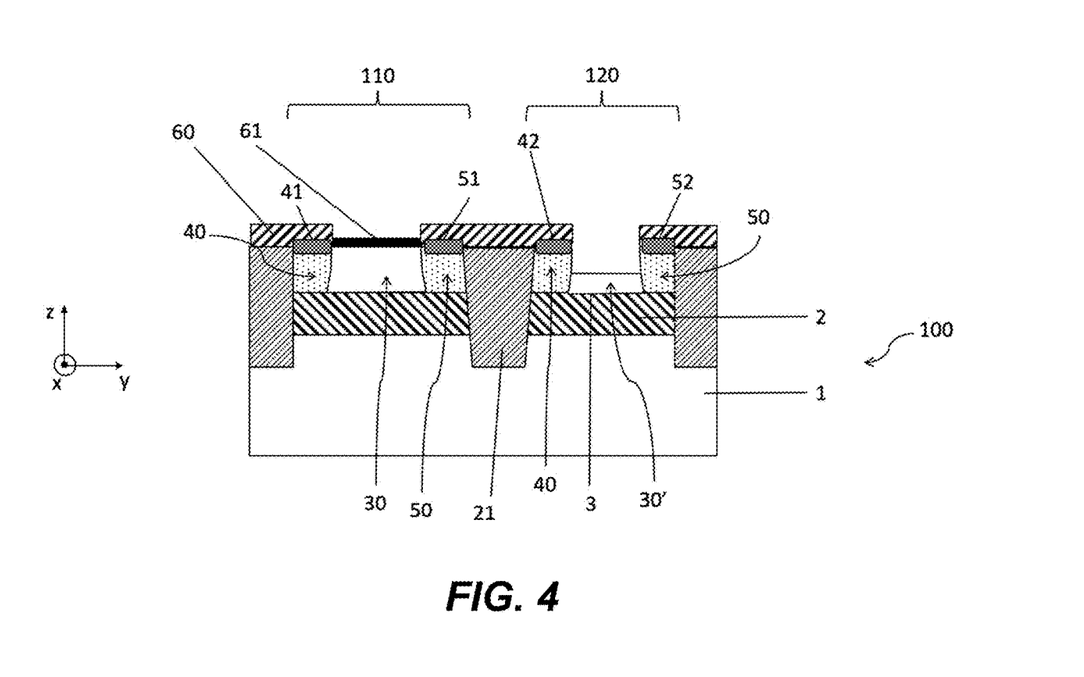
FIG. 4 presents the step d) of the method according to the disclosure.

Subsequently, the method comprises a step d) of thinning the top layer 3 in the channel regions 30 of the FET devices 120 of the second group, so as to reach a second thickness (FIG. 4). Preferably, the second thickness is comprised between 4 nm and 20 nm.

According to an advantageous embodiment, the second thickness is equal to a quarter of the length (along y axis on the figures) of the second preliminary gate 32, so as to operate the field effect transistor 120 of the second group (low power, low voltage) in a fully depleted mode.

If the first preliminary gate 31 was also removed during the step c), the top semiconductor-containing layer 3 in channel region 30 of the FET devices 110 of the first group is coated by a protection layer 61, during the thinning step, so as to remain at the first thickness (FIG. 4).

Advantageously, the step d) of thinning comprises a two-stages etch, in order to improve the accuracy of the second thickness. Specifically, a first etch is performed up to 1 nm to 5 nm of the targeted second thickness, followed by a second etch with slow etching rate to reach the second thickness. The first etch is even preferably performed up to 1 nm to 2 nm of the targeted second thickness. It is also preferably based on anisotropic dry etching. The second etch is performed by wet or dry etching, or by atomic layer etching, with a etch rate preferably lower than 1 nm/minute.

Of course, the thinning process may be adjusted and monitored by thickness measurement in the thinned channel regions 30' of the FET devices 120 from the second group.

Finally, the method according to the present disclosure comprises a step e) of forming functional gates 72 of the FET devices 120 from the second group, and if necessary (i.e., is the first preliminary gates 31 have been removed at step c)), forming functional gates 71 of the FET devices 110 from the first group.

The functional gates 71, 72 are advantageously all formed simultaneously on the channel regions 30, 30' of the FET devices 110, 120, which simplifies the process steps of the present method.

In the following description, we develop the case where both second functional gates 72 (i.e., from the second group FET devices 120) and first functional gates 71 (i.e., from the first group FET devices 110) are formed. It will be understood that process steps would be similar in the case where only second functional gates 72 are formed, except that the top of the first preliminary gates 31 (intended to be kept because functional) would be protected during the process steps.

Figure 5A:
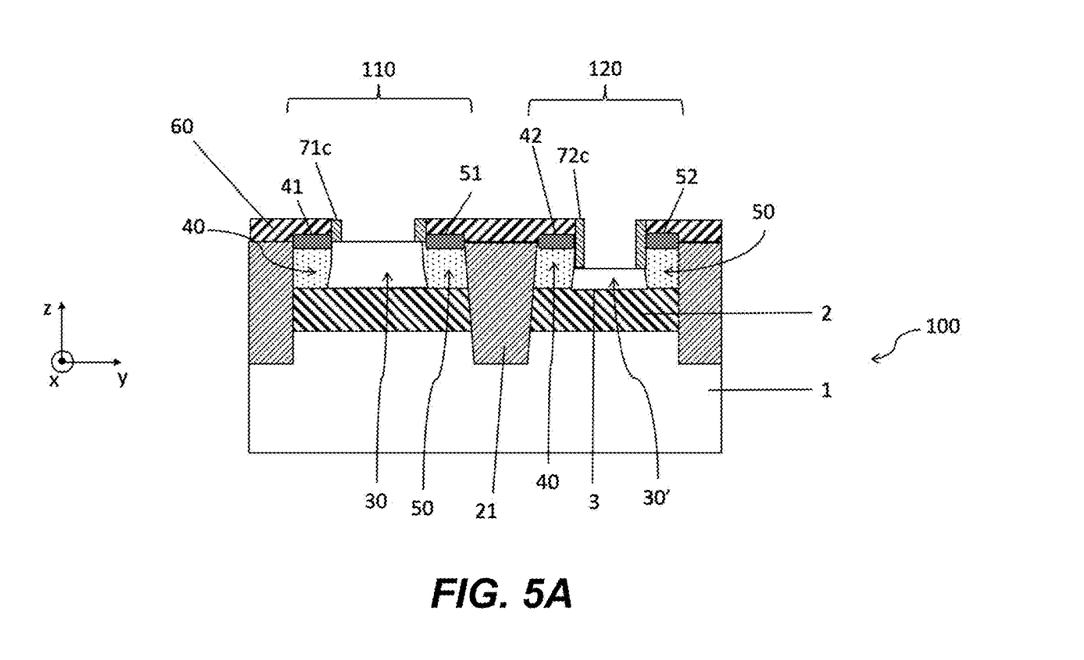
FIGS. 5A-5C present various stages in the step e) of the method according to the disclosure.

After removing the protection layer 61 from the top of the channel region 30 of the first FET device 110, the formation of functional gates 71, 72 comprises a first process step to create a silicon nitride or the like gate spacer 71c, 72c on the flanks of the gate electrode region apertures, by deposition and etch (FIG. 5A). It will allow control of short channel effects by offsetting source, drain and the extension ion implantation profiles from the edge of the gate, and to isolate the functional (conductive) gate electrodes 71, 72 from the surrounding conductive elements such as source/drain electrodes 41, 42, 51, 52 and metal contact.

Figure 5B:
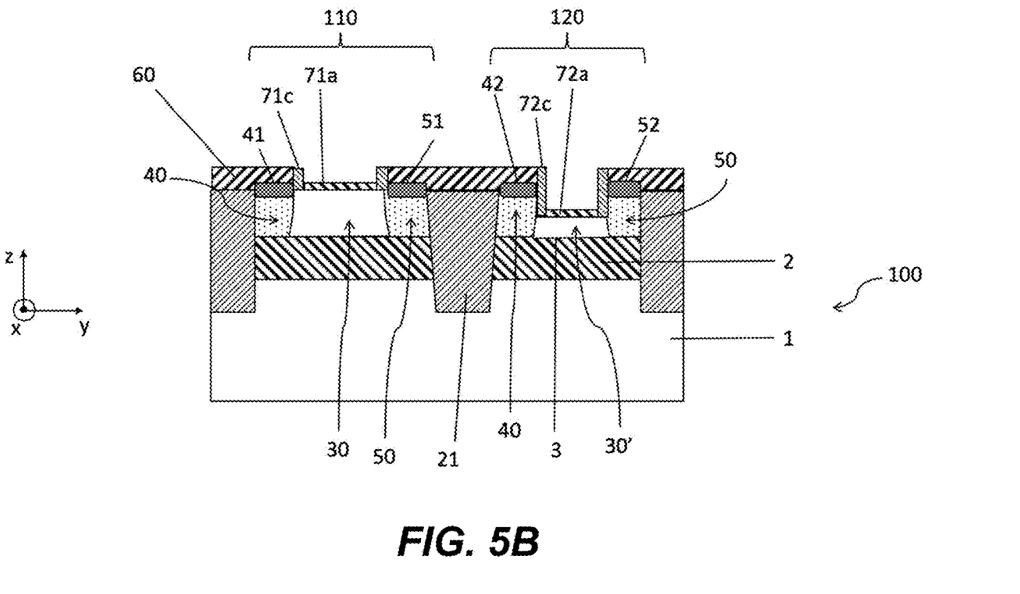
Figure 5C:
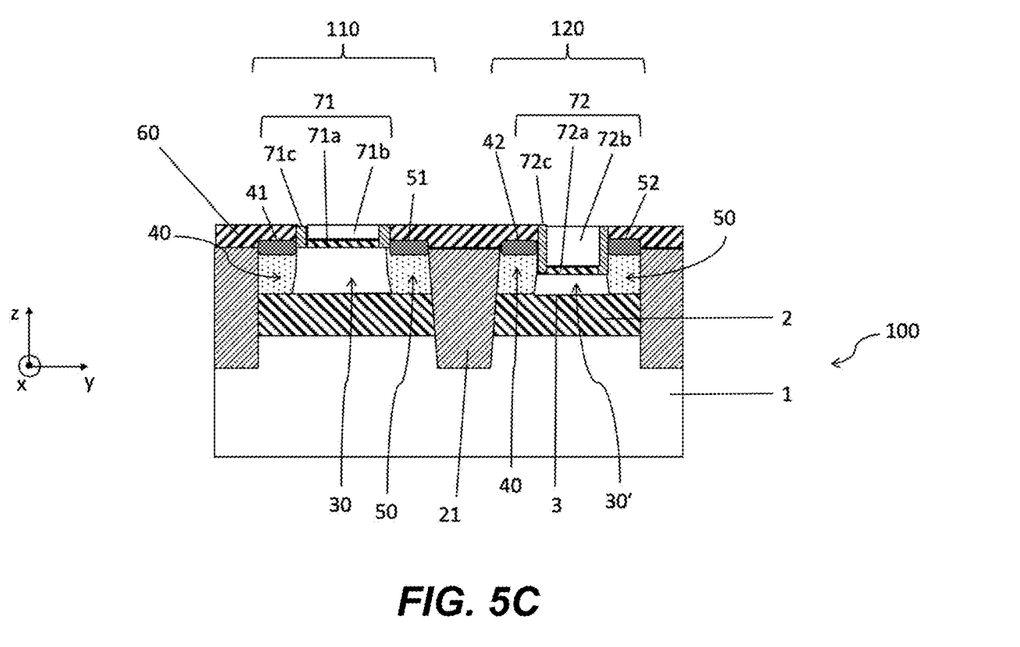

In a second process step, a thin gate dielectric 71a, 72a is formed for each FET device 110, 120, directly disposed on the channel regions 30, 30' of the top semiconductor-containing layer 3 (FIG. 5B). Finally, a gate electrode 71b, 72b disposed on the gate dielectric 71a, 72a is formed (FIG. 5C). The gate dielectric 71a, 72a may include oxides, nitrides, oxynitrides or combinations thereof. The gate electrode 71b, 72b may include conductive material such as tungsten, cobalt or even ruthenium for the more advanced CMOS technologies. The functional gates 71, 72 can be formed via conventional oxidation and/or deposition processes, and via lithography and etch processes for patterning.

At this stage of the method, the FET devices 110, 120 from the first and second groups are functional and each chip on the SeOI structure 100 comprises at least one FET device 110 of the first group and at least one FET device 120 of the second group.

Note that the field effect transistors 110, 120 may be based on planar, 3D or finFET device architectures.

The FET devices 110 of the first group are adapted to support high voltage analog, RF and I/O functions, as their channel region 30 presents the first thickness chosen between 20 nm and 50 nm, depending of voltage requirements. Their hot carrier injection reliability is insured thanks to the thicker channel thickness.

The FET devices 120 of the second group are adapted to provide low voltage logic and RF functions, with a channel region 30' presenting the second thickness, less than the first thickness and favorable to high performance and low leakage applications: thinner channel thickness with good uniformity improves gate control or short channel effect, thus it improves performance and reduce leakage.

The method for manufacturing a SOI integrated circuit chip of the present disclosure is advantageous in that it reduces the number of mask levels and process steps for fabricating the fully integrated mixed signal circuit, by streamlining the manufacturing stages of the first group and second group FET devices 110, 120.

Of course, the disclosure is not limited to the embodiments and to the examples described, and variant embodiments can be made without departing from the scope of the invention as defined by the claims.

Indeed, although the description indicates a first and a second group of FET devices 110, 120, whose channel regions 30, 30' present respectively the first thickness and the second thickness, the present disclosure is not limited to two groups of FET devices. The thinning step d) may comprise thinning the top semiconductor-containing layer 3 in channel regions of a third group of FET devices, so as to reach a third thickness, different from the second thickness; and the functional gate forming step e) may comprise forming functional gates on channel regions of the FET devices from the third group, simultaneously with the ones of the first (optionally) and second groups. The FET devices from the third group may be optimized to support a function other than the one supported by FET devices from the first and second groups, for instance middle voltage function. In such a case, the chip may comprise at least one FET device from the third group, in addition to the at least one FET device 110 from the first group and to the at least one FET device 120 from the second group.

Alternatively, the chip may comprise at least one FET device of the third group instead of the at least one FET devices of the first group or of the second group.

The invention claimed is:

1. A method for manufacturing a semiconductor-on-insulator integrated circuit chip comprising the following steps:
   a) providing a semiconductor-on-insulator structure having a buried insulating layer sandwiched between a support substrate and a top semiconductor-containing layer, the top semiconductor-containing layer having a first thickness between 20 nm and 80 nm throughout the semiconductor-on-insulator structure;
   b) building a plurality of field effect transistors, wherein each field effect transistor is isolated from others of the plurality and comprises:
      a preliminary gate above a channel region of the top semiconductor-containing layer, the field effect transistors from a first group having a first preliminary gate length and the field effect transistors from a second group having a second preliminary gate length smaller than the first preliminary gate length;
      a source region and a drain region comprising n-type or p-type dopants in the top semiconductor-containing layer, and extending down to the buried insulating layer;
      a source electrode and a drain electrode respectively on the source region and the drain region;
   c) removing at least the preliminary gate of the field effect transistors from the second group, leaving access to the channel regions of the field effect transistors of the second group;
   d) thinning the top semiconductor-containing layer in channel regions of the field effect transistors of the second group, so as to reach a second thickness between 4 nm and 20 nm, wherein the top semiconductor-containing layer in channel regions of the field effect transistors of the first group has the first thickness, the thinning comprising a two-stages etch including a first etch performed until a thickness of the semiconductor-containing layer is within 1 nm to 5 nm of the second thickness, and a second etch with a slower etching rate performed until the thickness of the semiconductor-containing layer reaches the second thickness; and
   e) forming functional gates simultaneously on channel regions of the field effect transistors whose preliminary gates were removed;
   wherein the integrated circuit chip comprises at least one field effect transistor of the first group and at least one field effect transistor of the second group.

2. The method of claim 1, wherein the step c) comprises removing the preliminary gates of the field effect transistors of the first group, leaving access to the channel regions of the field effect transistors of the first group.

3. The method of claim 2, wherein the first etch comprises an anisotropic dry etch.

4. The method of claim 2, wherein the second etch comprises a wet etch, a dry etch, or an atomic layer etch, with an etch rate lower than 1 nm/minute.

5. The method of claim 2, wherein the second thickness is equal to a quarter of a length of a gate electrode of the field effect transistors of the second group.

6. The method of claim 2, wherein the buried insulating layer has a thickness between 5 nm and a few micrometers.

7. The method of claim 1, wherein the step a) comprises, before formation of the preliminary gates forming back gates under the buried insulating layer in the support substrate opposite to the subsequently formed preliminary gates of the field effect transistors of the first group and/or of the second group.

8. The method of claim 1, wherein the field effect transistors have a planar architecture, a three dimensional architecture, or a finFET architecture.

9. The method of claim 1, wherein the field effect transistors of the first group comprise high voltage analog field effect transistors, radio frequency field effect transistors, and/or field effect transistors of input/output devices.

10. The method of claim 1, wherein the field effect transistors of the second group comprise low voltage digital field effect transistors and/or radio frequency field effect transistors.

11. The method of claim 1, wherein the step d) comprises thinning the top semiconductor-containing layer in channel regions of field effect transistors of a third group of field effect transistors, so as to reach a third thickness, different from the second thickness, and wherein step e) comprises forming the same functional gate on each channel region of the field effect transistors of the third group, wherein the integrated circuit chip further comprises at least one field effect transistor of the third group.

12. The method of claim 1, wherein the top semiconductor-containing layer comprises at least one material chosen from among silicon, silicon germanium, silicon carbide, III-V compounds or gallium nitride.

13. The method of claim 1, wherein the support substrate comprises monocrystalline and/or polycrystalline silicon, or a combination of other semiconductor materials.

14. The method of claim 1, wherein the first etch comprises an anisotropic dry etch.

15. The method of claim 14, wherein the second etch comprises a wet etch, a dry etch, or an atomic layer etch, with an etch rate lower than 1 nm/minute.

16. The method of claim 1, wherein the second thickness is equal to a quarter of a length of a gate electrode of the field effect transistors of the second group.

17. The method of claim 1, wherein the buried insulating layer has a thickness between 5 nm and a few micrometers.

* * * * *